United States Patent
Belady et al.

(10) Patent No.: US 7,791,889 B2
(45) Date of Patent: Sep. 7, 2010

(54) REDUNDANT POWER BENEATH CIRCUIT BOARD

(75) Inventors: Christian L. Belady, Mckinney, TX (US); Eric C. Peterson, McKinney, TX (US); Shaun L. Harris, Mckinney, TX (US); Steven A. Belson, Plano, TX (US); Gary W. Williams, Rowlett, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 961 days.

(21) Appl. No.: 11/059,189

(22) Filed: Feb. 16, 2005

(65) Prior Publication Data

US 2006/0181857 A1    Aug. 17, 2006

(51) Int. Cl.
*H05K 7/20*    (2006.01)

(52) U.S. Cl. .................. 361/721; 361/719; 361/715; 361/694; 361/695

(58) Field of Classification Search .......... 361/719, 361/721, 694, 695, 704, 715
See application file for complete search history.

(56) References Cited

U.S. PATENT DOCUMENTS

| | | | | |
|---|---|---|---|---|
| 5,930,115 A * | 7/1999 | Tracy et al. | | 361/704 |
| 6,014,313 A * | 1/2000 | Hesselbom | | 361/704 |
| 6,304,450 B1 * | 10/2001 | Dibene et al. | | 361/704 |
| 6,452,113 B2 * | 9/2002 | Dibene et al. | | 174/260 |
| 6,452,804 B1 * | 9/2002 | Dibene et al. | | 361/720 |
| 6,554,654 B1 | 4/2003 | Stoddard et al. | | |
| 6,771,507 B1 | 8/2004 | Belady et al. | | |
| 6,807,061 B1 * | 10/2004 | Harris | | 361/719 |
| 6,816,378 B1 | 11/2004 | Belady et al. | | |
| 6,819,562 B2 | 11/2004 | Boudreaux et al. | | |
| 6,837,719 B2 * | 1/2005 | Panella | | 439/67 |
| 7,064,955 B2 * | 6/2006 | Harris et al. | | 361/695 |
| 7,068,515 B2 * | 6/2006 | Harris et al. | | 361/709 |
| 7,072,185 B1 * | 7/2006 | Belady et al. | | 361/704 |
| 7,164,586 B2 * | 1/2007 | Lin | | 361/714 |
| 2002/0152425 A1 * | 10/2002 | Chaiken et al. | | 714/23 |
| 2003/0198033 A1 * | 10/2003 | Panella et al. | | 361/760 |
| 2005/0022054 A1 * | 1/2005 | Rasmussen et al. | | 714/10 |
| 2006/0109623 A1 * | 5/2006 | Harris et al. | | 361/690 |

OTHER PUBLICATIONS

David A. Klein, U.S. Appl. No. 10/800,837, filed Mar. 15, 2004, entitled "Multi-Processor Module".

* cited by examiner

*Primary Examiner*—Anatoly Vortman

(57) ABSTRACT

One embodiment includes an electronic assembly having a first printed circuit board (PCB) and a second PCB. The second PCB has at least two processors and is coupled to and disposed on a first side of the first PCB. A thermal dissipation device dissipates heat away from the processors. First and second power modules are coupled to and disposed on a second side of the first PCB, the first and second power modules providing redundant power to the two processors on the second PCB.

12 Claims, 5 Drawing Sheets

REDUNDANT POWER BENEATH CIRCUIT BOARD

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

As noted, packing density is one important criterion in many electronic systems. One way to reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

Heat dissipation is also an important criterion in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail.

As processor and memory technologies advance, power distribution architecture concurrently must evolve to meet demands of processors and memories. Designers consider many factors when developing power distribution architectures for electronic systems. For instance, one noted consideration is supplying reliable power to processor circuit boards. If a power converter fails, for example, then power to an entire circuit board can be lost. Another noted consideration is providing power conversion close to the load to decrease impedance associated with power delivery.

The design and layout of printed circuit board components can be quite complex and challenging. Designers must consider many important factors, such as packing density, heat dissipation, and power distribution architecture. Improvements in these areas can realize important benefits for electronic systems and devices.

SUMMARY

Embodiments in accordance with the present invention are directed to apparatus, methods, and systems for providing redundant power from beneath a circuit board. In one exemplary embodiment, an electronic assembly has a first printed circuit board (PCB) and a second PCB. The second PCB has at least two processors and is coupled to and disposed on a first side of the first PCB. A thermal dissipation device dissipates heat away from the processors. First and second power modules are coupled to and disposed on a second side of the first PCB, the first and second power modules providing redundant power to the two processors on the second PCB.

In another exemplary embodiment, a method comprises connecting a power distribution board with power conversion components directly to one side of a system board; connecting plural separate processor modules directly to a second, opposite side of the system board; and transferring power from the power distribution board through the system board and to the processor modules.

Other embodiments and variations of these embodiments are shown and taught in the accompanying drawings and detailed description.

DETAILED DESCRIPTION

Figure 1:
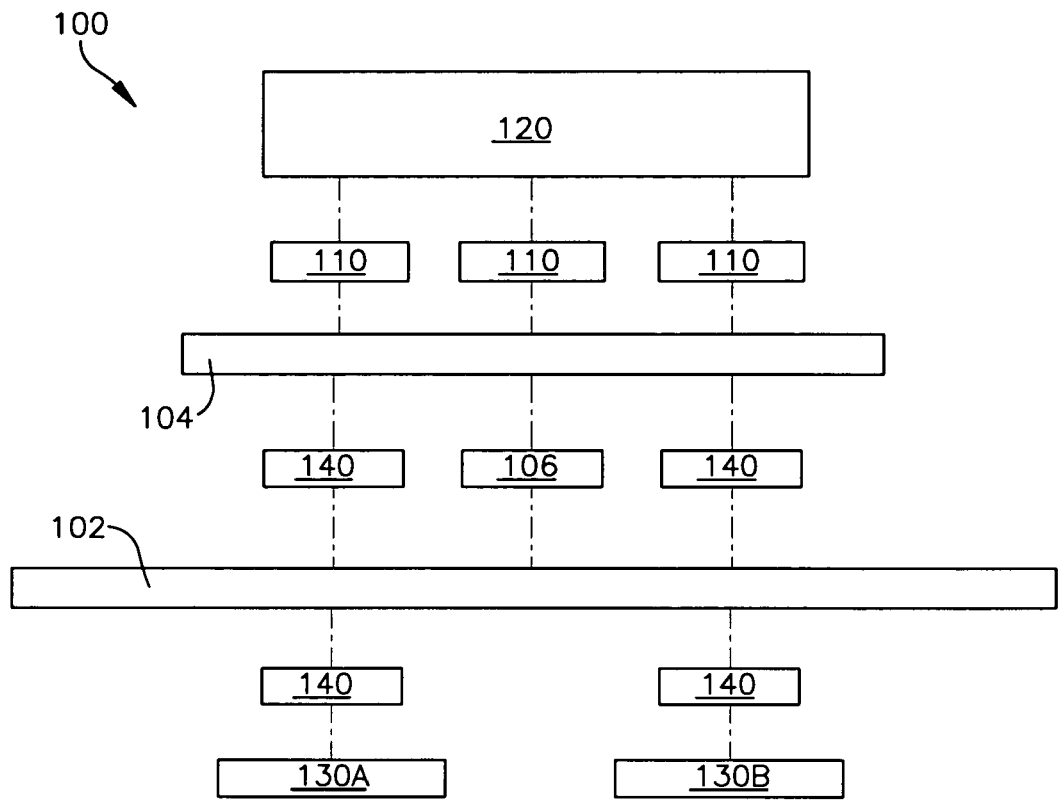
FIG. 1 is an exploded side view of a block diagram of an electronic assembly in accordance with an exemplary embodiment of the present invention.

FIGS. 1-5 show an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, ICs, modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connector 106, for example, can be used to electrically couple the PCB 102 to the PCB 104. Connector 106 provides a mechanical and electrical interface or connection between the PCBs. A single connector or multiple connectors can be used to provide connection between the PCBs. For example, if plural connectors are used, then one connector can be a connectable plug (male) and another connector a socket (female).

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 can also include a plurality of electronic components or device that may or may not generate heat or that may generate low or insignificant amounts of heat. Examples of such devices include, but are not limited to, resistors, capacitors, transistors, diodes, memories, etc.

The electronic assembly 100 can include at least one thermal dissipation device 120. A thermal dissipation device includes, but is not limited to, heat spreaders, cold plates, refrigeration (evaporative cooling) plates, heat pipes, mechanical gap fillers (such as a plurality of pins, rods, etc.), or other devices adapted to dissipate heat. Further, thermal dissipation devices include thermal compounds and thermal interface material that can be used to form a thermally conductive layer on a substrate, between electronic components, or within a finished component. For example, thermally conductive resins, tapes, molded thermoplastic compounds, adhesives, gap pads, and greases can be used between a heat-generating device and thermal dissipating device to improve heat dissipation and/or heat transfer. Further, such thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the thermal dissipation device, including heatsinks, can use liquids and/or phase change materials.

The electronic assembly 100 also includes multiple power supplies, power systems, or power modules 130A, 130B. Electrical connectors, connection mechanisms, or coupling devices 140 connect the respective power system 130A, 130B to the PCB 104.

The power systems 130A, 130B can be disposed at various locations on the PCB 102. For example, the power systems 130A, 130B can be located at opposite ends of the PCB 102, adjacent each other, horizontally stacked, or vertically stacked. Further, each power system (and accompanying thermal dissipation device, optionally provided) can be removably stacked or connected to the PCB 102.

The power systems 130A, 130B can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC-DC converter, AC-DC converter, DC linear regulator, DC switching regulator, or DC charge pump.

The two powers systems 130A, 130B can share responsibility for providing power to the electronic system 100 and/or the PCB 104. For example, the power systems 130A, 130B may be redundant power systems. Redundant power systems can serve as a duplicate for preventing failure upon failure of one of the power systems. In other words, if one power system fails, then the other power system can supply sufficient power to the system to provide continuous and uninterrupted power to the system. As an example, if power system 130A fails, then power system 130B could provide sufficient power to the PCB 104 and corresponding heat-generating components 110 for such components to operate normally. Alternatively, if power system 130B fails, then power system 130A could provide sufficient power to the PCB 104 and corresponding heat-generating components 110 for such components to operate normally.

The two power systems 130A, 130B may also be modular and replaceable. In some embodiments, each power system 130A, 130B is an independently-operable unit that can be constructed with standardized units or dimensions for flexibility and replaceability for use in the electronic assembly 100. Further, each power system 130A, 130B can be connected to or removed from the electronic assembly (example, the PCB 102) without connecting, removing, or replacing other components in the electronic assembly 100 (example, the PCB 104 or the heat-generating components 110). By way of illustration, suppose that power system 130B fails or otherwise needs replaced or upgraded. The power system 130B (and accompanying thermal dissipation device, optionally provided) can be disconnected and removed from the PCB 102 without removing or replacing the power system 130A, PCB 104, thermal dissipation device 120 and/or the heat-generating components 110. As another illustration, suppose that power system 130A fails or otherwise needs replaced or upgraded. The power system 130A (and accompanying thermal dissipation device, optionally provided) can be disconnected and removed from the PCB 102 without removing or replacing the power system 130B, PCB 104, thermal dissipation device 120, and/or the heat-generating components 110. Further yet, either power module can be removed and/or replaced without electrically and mechanically disconnecting the PCBs 102 and 104.

The power systems can be disconnected and connected independent of each other and support hot-swapping (i.e., the ability to add and remove devices to and from a computer or electronic device while the computer or electronic device is running with the operating system automatically recognizing the changed or newly added component). For example, if power system 130B fails, then the power system (including power system 130B, optional thermal dissipation device, and other electronic components) can be removed from the PCB 102 while the electronic assembly 100 is running and continues to run without interruption. Power supply to the electronic system (for example, to PCB 104) can be continuous since power system 130A will automatically assume power supply responsibilities for power system 130B as soon as it fails and while it is disconnected or otherwise not functional.

Once connected, the PCB 102 is generally parallel to the PCB 104. The PCBs 102 and 104 are mechanically and electrically connected to form a vertical stacked-up configuration. In particular, connector 106 couples the PCBs together. The PCB 102 is separated from the PCB 104 by a distance approximately equal to the height or thickness of the connector 106 when connected together.

Although PCBs 102 and 104 are shown to form a vertical stacked-up configuration, other configurations are also within embodiments in accordance with the present invention. For example, the PCBs 102 and 104 can be connected to form a horizontal stacked configuration or other stacked or non-stacked configurations.

As shown, the thermal dissipation device 120 is positioned directly above the heat-generating components 110 of the PCB 104 and substantially fills a volume of space that extends above a top surface of the heat-generating components 110.

The PCB 104 connects to one side of the PCB 102. The power systems 130A, 130B connect to a second, opposite side of the PCB 102. For instance, the PCB 104 can connect to a top side of the PCB 102, and the power systems 130A, 130B can connect to a bottom side of the PCB 102 (i.e., underneath the PCB 102).

Figure 2:
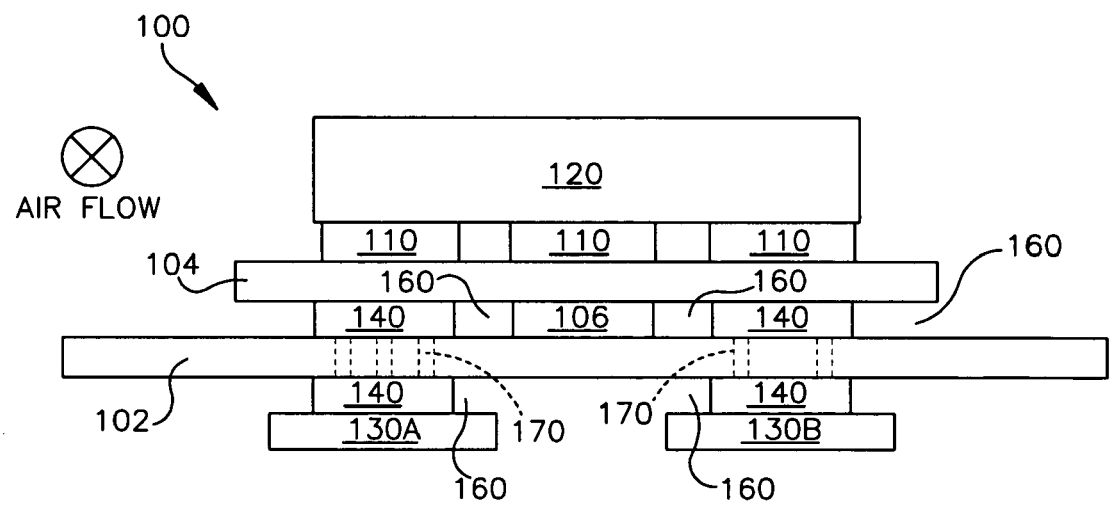
FIG. 2 is a side view of the electronic assembly of FIG. 1 with the electronic assembly being assembled together.

In one exemplary embodiment, the each power system is directly beneath one heat-generating component 110. As best shown in FIGS. 1 and 2, the connectors 140 vertically align with each other. In other words, power system 130A has a connector 140 that is directly beneath and aligned with a corresponding connector for the heat-generating component 110 located directly above power system 130A. Further, power system 130B has a connector 140 that is directly beneath and aligned with a corresponding connector for the heat-generating component 110 located directly above power system 130B.

Figure 3:
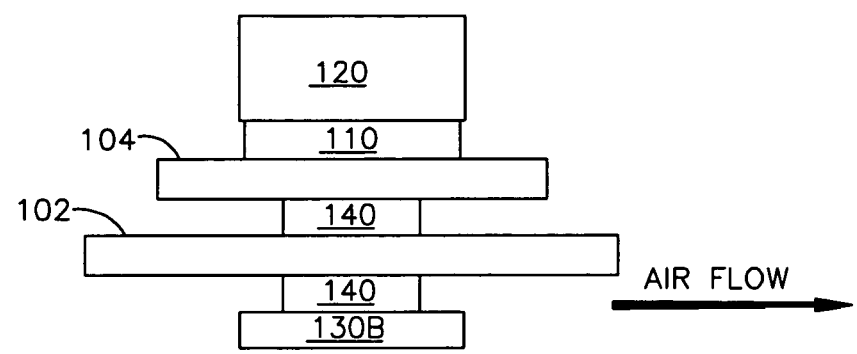
FIG. 3 is an end view of FIG. 2.
Figure 4:
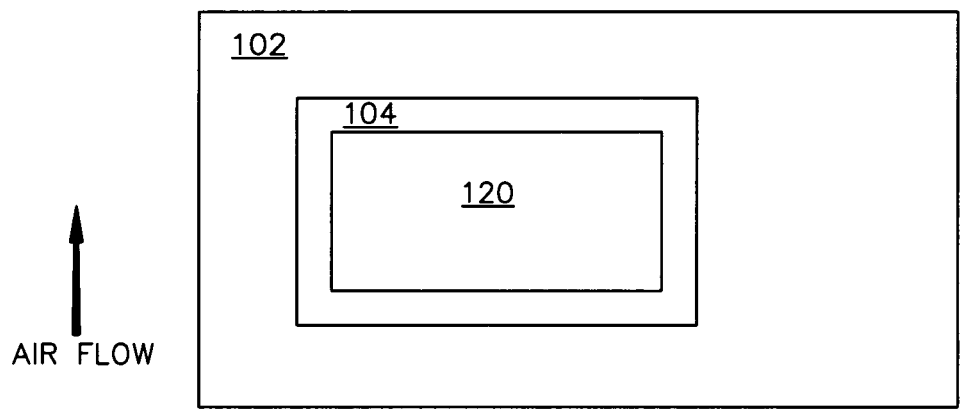
FIG. 4 is a top view of FIG. 2.
Figure 5:
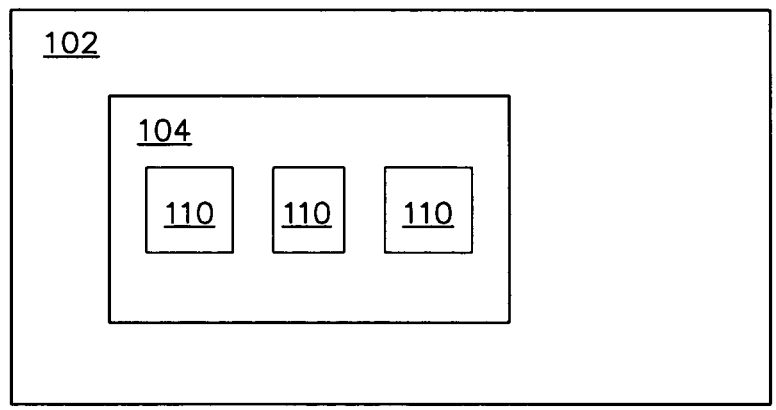
FIG. 5 is a top view of the FIG. 2 with the thermal dissipation device removed from the electronic assembly.

For purposes of illustration only, the electronic assembly 100 is shown with an airflow direction as indicated with arrows in FIGS. 2-4 (the airflow being into the page and indicated with a circle and "X" in FIG. 2). The airflow can be provided, for example, with a fan or other device positioned within the electronic assembly 100 or within any thermal dissipation device, such as thermal dissipation device 120. The airflow is directed in a pathway that is parallel to the PCBs 102 and 104. A primary airflow can be directed at, below, and/or above the PCB 104. For instance, the primary airflow can be directed at the thermal dissipating device 120, the power systems 130A, 130B, and the heat-generating components 110. Thus, the same airflow can be used to cool or dissipate heat simultaneously from the thermal dissipating device 120, the power systems 130A, 130B, and heat-generating components 110.

One or both of the power systems 130A and 130B can be cooled with a variety of embodiments, including either or both of (1) direct heat exchange with a thermal dissipation device and (2) an airflow created by a thermal dissipation device. In one exemplary embodiment, a single thermal dissipation device, such as device 120, simultaneously cools or dissipates heat for both power systems 130A, 130B and heat-generating components 110 on the PCB 104. For instance, both power systems 130A and 130B can be in the direct pathway of airflow created by the thermal dissipation device 120. The airflow pathway directed onto the power systems 130A, 130B can provide sufficient cooling so that the power systems do not require additional cooling or additional cooling devices in order to operate properly or within a specified or normal temperature range. In another exemplary embodiment, each power system 130A, 130B is cooled from its own dedicated thermal dissipation device. In still other embodiments, the power systems 130A, 130B do not require any thermal dissipation device in order to operate. As such, the power systems 130A, 130B may or may not require assistance to dissipate heat from the power systems or power modules.

In order to further increase the packing density or increase an effective use of space in the electronic assembly 100, the unused space 160 located between PCB 104 and PCB 102 or between power systems 130A, 130B and PCB 102 (see FIG. 2) can be occupied with electronic components. Such electronic components can include heat-generating or non-heat-generating devices. Preferably, these components include non-heat-generating devices or low heat-generating devices, such as electronic components that do not require the use of a thermal dissipating device to operate properly. The unused space 160 can include the electronic components or elements associated with the power systems 130A, 130B. By way of example only, these components include, but are not limited to, pulse width modulation (PWM) devices, switches, bit tests (such as testing the value of specific bits in memory or registers), and bus architecture (such as I$^2$C buses).

In order to establish electrical connection between various components (such as from power systems 130A, 130B through PCB 102 and to PCB 104 and heat-generating components 110), various connections can be utilized. These various connections can also facilitate modularity within the electronic assembly. Thus, the connectors 140 and 106 and/or connection mechanisms for connecting components (including connections between PCBs or through PCBs) are not limited to any specific embodiment. By way of example, such connections include, but are not limited to, edge-connectors, land grid arrays (LGAs), ball grid arrays (BGAs), column grid arrays (CGAs), pin grid arrays (PGAs), plugs (example, male), sockets (example, female), pins, connectors, soldering, or other removable or disconnectable attachments. Such connectors include various board-to-board connections, such as one-piece and two-piece board-to-board connectors and level 2 or L2 connectors or attaches as defined by NEDA (an educational foundation through which major connector companies agreed on a set of levels that define the categories of connectors). As a further example, the connectors include embodiments utilizing vias (see, example, dashed lines 170 in FIG. 2). A via is a pad with a plated or electrically conductive through hole. Vias (also known as feed-through holes) transmit or move signals from one layer to the other. For example, vias can be used to make the transition from the pins or connector down to stripline traces. Various via structures can be used, such as normal, blind, and back-drilled vias. Further, a connection mechanism between PCBs 102 and 104 and between power systems or power modules (such as 130A, 130B) can be located at various positions, such as, but not limited to, the interior, the sides and/or ends of the PCBs. Further, such connections can pass through a hole or opening in the PCB 102 or pass around or adjacent the PCB 102 to establish connection between the power system and PCB 104. Further yet, soldering can be used in place of or in conjunction with any connection. Additional examples of connections can be found in U.S. Pat. No. 6,554,654 entitled "Multi-Pin Edge Connector for Circuit Board" incorporated herein by reference.

As one example, the power systems 130A, 130B are mounted to an underside of the PCB 102 through an L2 attach system (shown as connectors 140 located between the power systems 130A, 130B and PCB 102). Output pins of each power system 130A, 130B are connected to the heat-generating components 110 above PCB 104 by means of pins through the L2 attach or another connector placed for the purpose of delivering power from the power system to the heat-generating component. The power is transferred through the PCB 102 (example, system board or motherboard) by vias 170 (see FIG. 2) in the PCB 102 or through passthrough pins of a connector designed for transferring power to the heat-generating components 110.

In one exemplary embodiment, power from the power systems 130A, 130B is transferred from the power systems to an L2 attach, through vias of PCB 102, to an L2 attach of the heat-generating components 110 of the PCB 104. Output of a power converter is thus located at the input of the heat-generating component (such as the processor, ASIC, etc.). The physical length of travel for transmission of converted power is short. For example, in one embodiment, this length is approximately equal to two L2 attaches and a thickness of the PCB 102.

Figure 6:
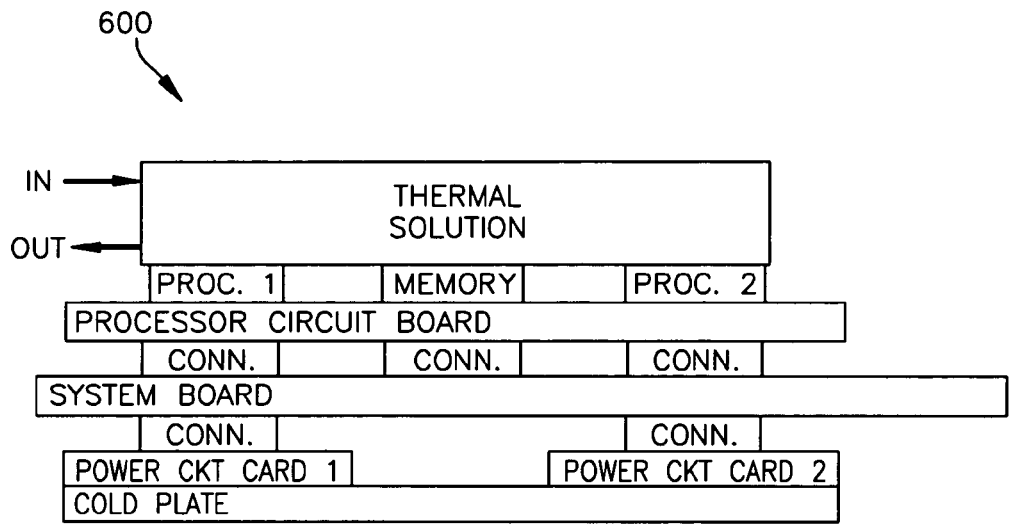
FIG. 6 is a side view of an exemplary embodiment of an electronic assembly.

Various different electronic components and PCBs can be combined into embodiments in accordance with the invention. FIG. 6 illustrates one such exemplary embodiment as electronic assembly 600. In this figure, a system board connects to a processor circuit board with various connectors or connection mechanisms. The processor circuit board includes a plurality of heat-generating components, shown as plural processors and memory. A single thermal dissipation device (shown as a thermal solution) extends above the heat-generating components. The thermal dissipation device is positioned directly above the processor circuit board to cool and dissipate heat, via direct heat exchange, for the processors, memory, and other heat-generating components on the surface of the processor circuit board. The processor circuit board connects to one side of the system board, and two power circuit cards connect to a second, opposite side of the system board. The power circuit cards provide redundant power to the processor circuit board. A single thermal dissipation device (shown as a cold plate) extends below or across the power circuit cards for dissipating heat away from these cards.

As shown in FIG. 6, one or both of the power systems (shown as power circuit boards) can be cooled via direct heat exchange with a single thermal dissipation device (shown as a cold plate). Heat generated from both power systems can be evacuated or dissipated from a top or outer surface of the cold plate.

Thermal dissipation from the power systems is not limited to a specific embodiment. For example, the thermal dissipation device can extend around, at, above, adjacent, or below any one or numerous surfaces of the power systems. Further yet, multiple thermal dissipation devices (as shown in FIG. 7, for example) can be used to evacuate or dissipate heat away from the power systems.

The thermal dissipation devices can utilize and/or comprise a remote heat exchanger (RHE). An RHE enables the thermal dissipation device to be remote from the heat-generating device (such as PCB 104, heat-generating components 110, and/or power systems). For example, heat can be transferred from the heat-generating device to an attachment block having a heat pipe. Further, the heat pipe can be integral to the module or any portion of the electronic system (example, the thermal dissipation device) and extend outwardly from the electronic system to a remote heatsink. Alternatively, the heat pipe can attach to a surface of the module or system (example a surface of a thermal dissipation device) and then extend to a remote heatsink. The heat pipe, for instance, can be a hollow copper pipe containing a fluid and wicking material. Through a process of vaporization and re-condensation, heat travels through the heat pipe to a heat exchanger, such as a finned heat sink. Localized airflow can be used to evacuate the heat to the environment.

In embodiments in accordance with the invention, one or more thermal dissipation devices could be or could utilize a cold-plate and/or could utilize heat dissipation via heat pipes or liquids. For example, looking to FIG. 6, the "In" and "Out" arrows signify liquid-in and liquid-out, respectively, and can be utilized with one or more thermal dissipation devices. As such, the thermal dissipation devices can be coupled to a pump and/or a heat exchanger to circulate a cooling liquid through the thermal solution to cool any one or combination of PCBs, heat-generating components, power system, etc. The thermal dissipation devices can be utilized in conjunction with one or both of the heat conduction and/or airflow cooling techniques discussed herein. As one example, the thermal dissipation devices can include a separate piece or unit on a top or bottom surface. This separate piece could be a liquid cold plate, evaporator, refrigerator, heatsink, or other device or technology known in the art.

Figure 7:
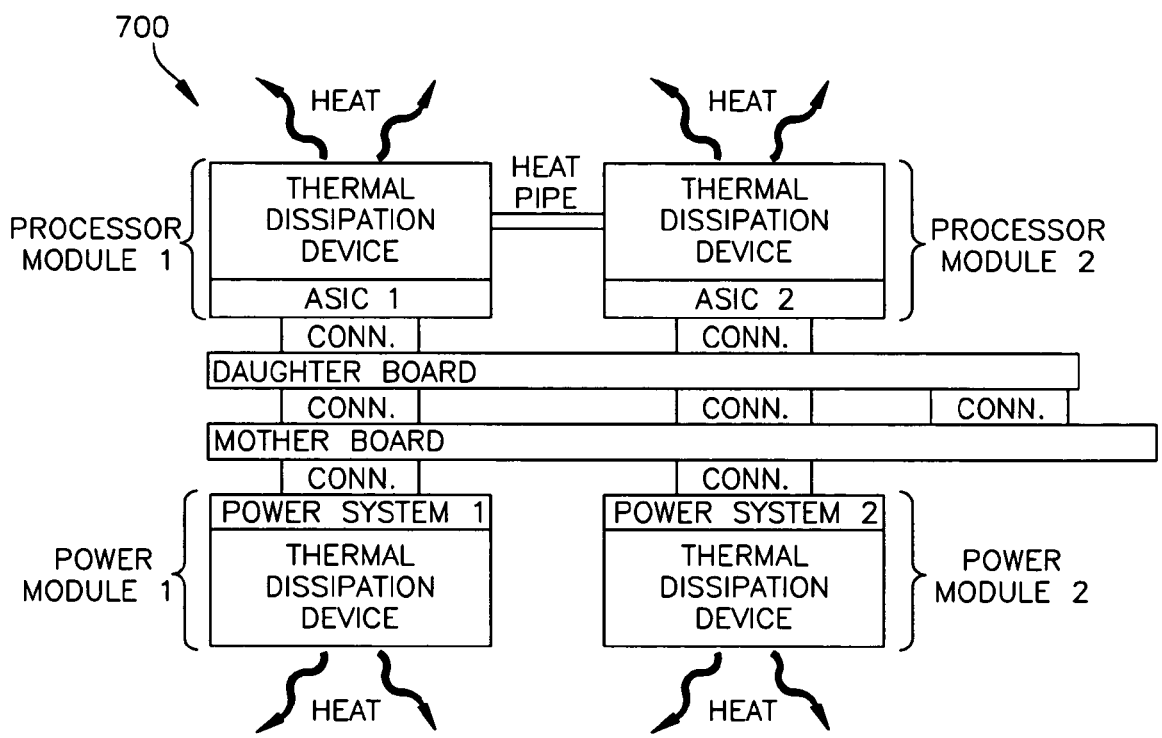
FIG. 7 is a side view of another exemplary embodiment of an electronic assembly.

FIG. 7 illustrates another exemplary embodiment as electronic assembly 700. In this figure, a motherboard connects to a daughterboard with various connectors or connection mechanisms. The daughterboard includes a plurality of heat-generating components, including, but not limited to, two ASICs. Each ASIC includes a separate thermal dissipation device extending above and located on a top surface of the respective ASIC. Each thermal dissipation device cools and dissipates heat, via direct heat exchange, for the respective ASIC. The daughterboard connects to one side of the motherboard, and two power systems connect to a second, opposite side of the motherboard. The power systems provide redundant power to the daughterboard. Each power system includes a separate thermal dissipation device. Each thermal dissipation device cools and dissipates heat, via direct heat exchange, for the respective power system.

Heat can be evacuated or dissipated from both sides of the motherboard. On a first side, heat is dissipated from an outer or top surface of the thermal dissipation devices connected to the ASICs. On a second side, heat is dissipated from an outer or top surface of the thermal dissipation devices connected to the power systems.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

In FIG. 7, the electronic assembly 700 comprises several different modules that interconnect to form the electronic assembly or a portion or sub-assembly of the electronic assembly. One side of the motherboard includes at least two processor modules. Each processor module includes a heat-generating component (such as a processor or ASIC) and a thermal dissipation device. The processor modules can removably connect to the one side of the daughterboard. In alternate embodiments, each processor module can include its own daughterboard. Two or more daughterboards can be connected together. A second side of the motherboard includes at least two power modules. Each power module includes a power system and an optional thermal dissipation device. In alternate embodiments, the power systems can be located on the same PCB.

Embodiments in accordance with the present invention can utilize a variety of modules. As an example, looking to FIG. 7, the daughterboard can be a multi-processor module that includes heat-generating components (such as plural separate processors, ASICs, memories, etc. all on the same board or card). As another example, the two separate power modules can be removably connected to each other. As another example, the two separate power modules can be disposed adjacent each other and connect together via connectors. Once connected, the two power modules can form a single, larger power module with redundant power. As yet another example, a single processor module and a single power module can be connected together to form a power/processor module.

Still looking to FIG. 7, a processor/power module can comprise two halves that mechanically and electrically connect or couple together. A first half includes the two power system modules (shown as power module 1 and power module 2). The power system modules can include a power system with or without a thermal dissipation device. A second half includes the two processor modules (shown as processor module 1 and processor module 2). The processor modules include the heat-generating components and can optionally include the thermal dissipation devices. In order to assemble the processor/power module, the first half (i.e., the power modules) is coupled or connected to a first side of the PCB 102. A second half (i.e., the processor modules) is coupled or connected to a second side (opposite the first side) of the PCB 102. The PCB 102 is sandwiched between the processor/power module. Further, as shown, when the processor/power module is assembled, the heat-generating components can be positioned inside a housing of the processor/power module itself. This configuration increases packing density of the module.

Further, embodiments in accordance with the present invention can utilize a modular connective architecture. If a particular electronic component (including PCBs) or device fails or otherwise needs to be replaced, the electronic component can be removed from the electronic assembly and replaced with a new and/or different component. As such, the electronic assemblies can be constructed with standardized electronic components and/or dimensions to enable flexibility and variety of use and exchange of components. Looking to FIG. 7 as an example, if a power module fails or needs to be replaced, the power module can be disconnected or uncoupled and removed from the electronic assembly 700 while the two processor modules remain mechanically and electrically connected to the daughterboard. A new and/or different power module can thereafter be connected to the motherboard and utilized with the electronic assembly 700. While one of the power modules is failed or removed from the electronic assembly 700, the second power module provides sufficient power to the daughterboard so electronic components thereon can normally operate.

The power modules can have various configurations. For illustration purposes, the power module can have a generally square or rectangular configuration. A top surface is formed from one outer surface of the thermal dissipation device, and an opposite bottom surface is formed from one outer surface of the power system, such as a power circuit card or power board.

A module can include a variety of different heat exchanging or heat transferring interfaces (such as the interface between two thermal dissipation devices or the interface between a thermal dissipation and a PCB or a heat-generating component or the interface between two power modules or components within a power module). These interfaces can be adapted to enhance heat conduction or heat exchange. For example, the interfaces can include conductive resins, tapes, adhesives, gap pads, greases, or any other device or compound that facilitates or improves heat conduction.

The electronic assembly 700 includes a plurality of different layers that are stacked together in a vertically arrangement. A first or top layer includes the processor modules. This first layer connects to a second layer, shown as the daughterboard, and the second layer connects to a third layer, shown as the motherboard. The third layer connects to a fourth or bottom layer, shown as the power modules.

Embodiments in accordance with the invention are not limited to any number or type of thermal dissipation devices. Further, separate thermal dissipation devices can be coupled together. For example, a liquid heat pipe (or other device known in the art) could extend from one thermal dissipation device to another thermal dissipation device and then to a remote heatsink. In FIG. 7, for example, instead of dissipating heat from a surface of the thermal dissipation devices, a liquid heat pipe could extend between each thermal dissipation device above the respective ASICs. The heat pipe would assist in removing heat from each thermal dissipation device. Thereafter, the transferred heat could be dissipated in a variety of ways discussed herein, including but not limited to use of air, liquid cold plates, additional heat pipes, heat dissipation, remote heatsink, etc.

Figure 8:
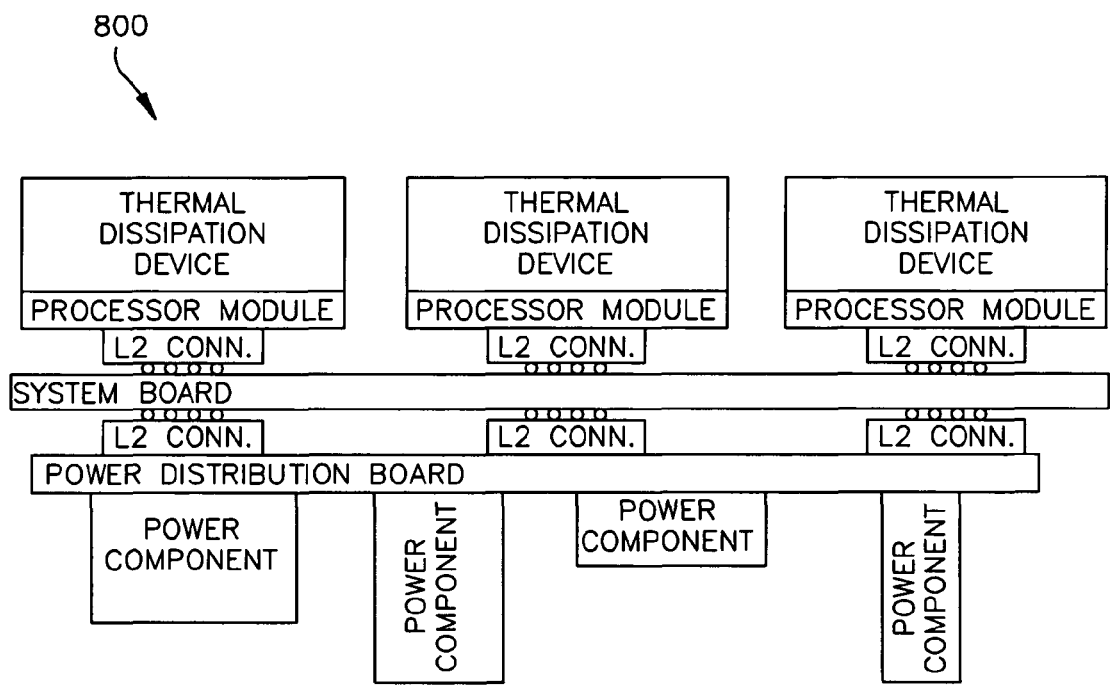
FIG. 8 is a side view of another exemplary embodiment of an electronic assembly.

FIG. 8 shows another exemplary embodiment of an electronic system 800. In this figure, plural processor modules connect to one side of a system board via an L2 connection. Each processor module, for example, can include a processor or ASIC, daughter card, memory, and other electronic components. Further, each processor module can include its own thermal dissipation device for dissipating heat away from heat-generating components on its processor module. For illustration, three different processor modules are shown, but the number of modules can be more or less than three. A power distribution board connects to an opposite side of the system board via plural L2 connections. The L2 connections are located on one side of the power distribution board, and various power conversion components are located on an opposite side of the power distribution board. Thus, the power distribution board can consist of power distribution layers and power conversion components.

In FIG. 8, the system board has processing modules mounted to one side and power distribution mounted to an opposite side. In this embodiment, power is transferred directly to the processors at each processor module through defined via locations. As shown, the L2 connections are directly opposite each other on different sides of the system board so power transfers from the power distribution board, through a first L2 connect, through the system board, and to a second L2 connect of a processor or ASIC. In this embodiment, power conversion is close to the load and provides N+1 power conversion. A single power board is thus able to provide redundant power to multiple, separate processing modules.

Figure 9A:
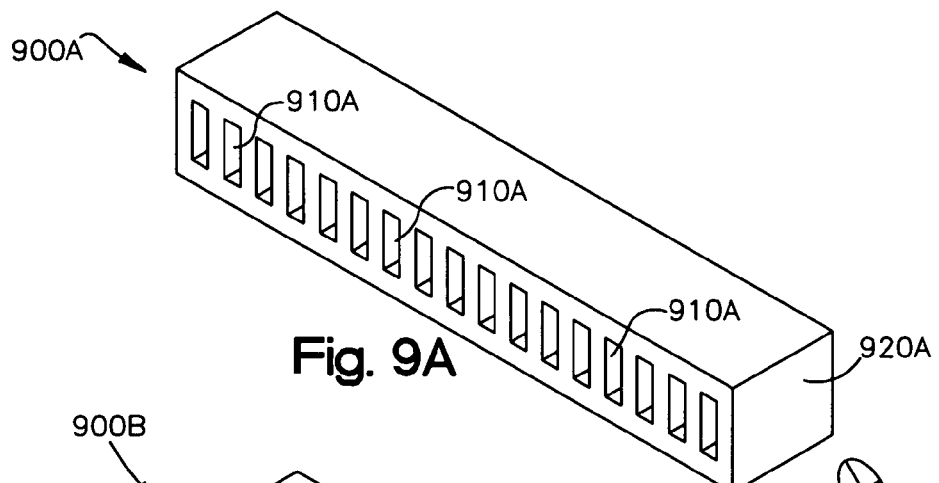
FIG. 9A is an exemplary embodiment of a thermal dissipation device.
Figure 9B:
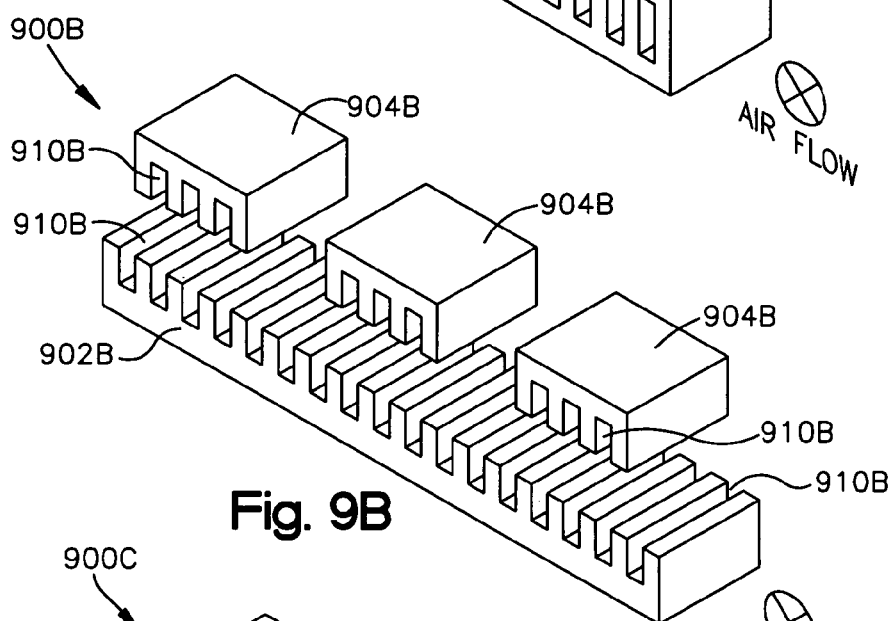
FIG. 9B is another exemplary embodiment of a thermal dissipation device.
Figure 9C:
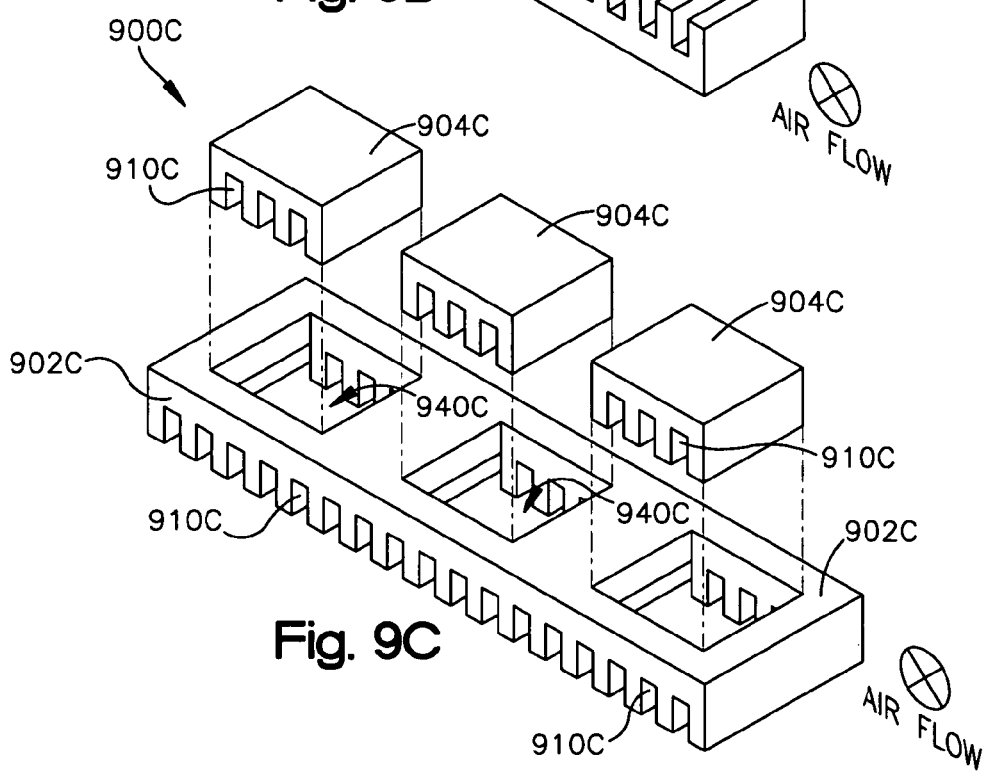
FIG. 9C is another exemplary embodiment of a thermal dissipation device.

As noted, the thermal dissipation devices in accordance with the present invention can comprise multiple different, separate members or a unitary or single member and utilize a wide variety of types of thermal dissipation devices. Some examples of additional various embodiments that can be utilized in conjunction with the electronic assembly are shown in FIGS. 9A to 9C. These examples illustrate a single airflow, but multiple airflows with various directions are within embodiments in accordance with the invention.

FIG. 9A shows a thermal dissipation device 900A having a plurality of openings 910A that extend through a body portion 920A. The openings 910A can have a variety of configurations and/or shapes and include slots, holes, etc. and can be formed from adjacent pins, rods, fins, etc. The openings 910A enable an airflow (the airflow being into the page and indicated with a circle and "X") to pass through the thermal dissipation device 900A.

FIG. 9B shows another example of a thermal dissipation device 900B formed from a base component 902B and a plurality of other separate components 904B. The base and separate components have a plurality of openings 910B. The openings 9101B can have a variety of configurations and/or shapes and include slots, holes, etc. and can be formed from adjacent pins, rods, fins, etc. The openings 910B enable an airflow (the airflow being into the page and indicated with a circle and "X") to pass through the thermal dissipation device 900B.

FIG. 9C shows another example of a thermal dissipation device 900C formed from a base component 902C and a plurality of other separate components 904C. The base and separate components have a plurality of openings 910C. The separate components 904C are separate and removable from the base portion 902C and extend through holes or openings 940C in the base portion 902C. The openings 910C can have a variety of configurations and/or shapes and include slots, holes, etc. and can be formed from adjacent pins, rods, fins, etc. The openings 910C enable an airflow (the airflow being into the page and indicated with a circle and "X") to pass through the thermal dissipation device 900C.

Embodiments in accordance with the invention are not limited to two power systems/modules, two processor modules, a single PCB 104, a single PCB 102, or a single multi-processor module. For example, plural power systems can be stacked or arranged on a single PCB. For example, two, three, or more power modules can be vertically or horizontally stacked on a PCB (such as being stacked or placed below a motherboard). Such power modules can be electrically and mechanically connected to each other. Further, plural PCBs can be stacked or arranged on each other or on another PCB. For example in FIG. 2, the PCB 102 can include plural PCBs 104 stacked or arranged on PCB 102.

Further, the power system and/or power module can provide a power source that is proximate or close to the load (example the PCB 104) in order to minimize noise and optimize step load performance. Further, embodiments in accordance with the present invention provide a more compact system since area below the PCB 102 is used for power conversion and area above the PCB 102 is used for processings. As such, layers of the system board itself (such as PCB 102) do not have to be used to deliver power to electronic components. The layers of the system board can, thus, be provided with more space and capacity for signaling. Further yet, embodiments in accordance with the present invention provide separate power delivery planes from signaling layers in the system board. This configuration can reduce impact from power noise being coupled to signaling in the board. Still further yet, embodiments in accordance with the present invention enable power modules or power systems to be readily changed to satisfy new or different voltage requirements for the electronic system. Furthermore, the power module includes all necessary electronic components to provide power to the heat-generating components. Embodiments in accordance with the present invention, thus, provide N+1 redundancy of the power conversion system.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural processors, ASICs, memories, and other electronic devices. The first circuit board can be connected to a second circuit board in a vertical or horizontal stacked-up configuration. Plural processor modules can be connected to a first or top side of the first circuit board. Plural power modules can be connected to a bottom side of the second circuit board. The power modules supply redundant power to the plural heat-generating components of the first circuit board. Further, the power modules can be vertically or horizontally stacked or adjacent each other or spaced apart from each other. Single or multiple thermal dissipation devices can thermally dissipate heat away from the heat-generating devices and the power systems. Further, at least one thermal dissipation device can generate a primary airflow path that is directed toward a thermal dissipation device, the heat-generating components, the processor modules, and/or the power systems.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic assembly, comprising:
   a first printed circuit board (PCB);
   a second PCB having at least two processors, the second PCB being coupled to and disposed on a first side of the first PCB;
   a thermal dissipation device for dissipating heat away from the processors; and
   first and second power modules coupled to and disposed on a second side of the first PCB, the first and second power modules providing redundant power to the two processors on the second PCB, wherein the first and second power modules are separated and supply redundant power such that upon failure of the first power module, the second power module provides power for both power modules to the two processors, and each of the first and second power modules connects to the second side of the first PCB in a vertically stacked configuration.

2. The electronic assembly of claim 1 wherein the first and second power modules each include a separate thermal dissipation device.

3. The electronic assembly of claim 1 wherein both the first and second power modules are removable from the second side of the first PCB without disconnecting the first PCB from the second PCB.

4. The electronic assembly of claim 1 wherein power transfers from the first and second power modules, through a first level 2 connect, through the first PCB, and to a second level 2 connect connected to at least one of the two processors.

5. The electronic assembly of claim 1 wherein:
   the first power module includes power conversion components and a first thermal dissipation device for dissipating heat from the first power module;
   the second power module includes power conversion components and a second thermal dissipation device for dissipating heat from the second power module.

6. The electronic assembly of claim 1 wherein the first and second power modules are cooled with an airflow generated from the thermal dissipation device.

7. The electronic assembly of claim 1 wherein the first power module is directly beneath one processor and the second power module is directly beneath another processor.

8. An electronic assembly, comprising:
   a first printed circuit board (PCB);
   a second PCB including plural processors and being connected to a first side of the first PCB;
   a thermal dissipation device that dissipates heat away from the plural processors; and first and second power modules connected to and disposed on a second, bottom side of the first PCB in a vertically stacked configuration, the first and second power modules are separated and provide redundant power to the plural processors such that the second power module provides power for the plural processors upon failure of the first power module.

9. The electronic assembly of claim 8, wherein after failure of the first power module, the first power module is disconnected and removed from the first PCB while the electronic assembly continues to run without interruption.

10. The electronic assembly of claim 8, wherein after failure of the first power module, the first power module is disconnected and removed from the first PCB without removing the second power module, the second PCB, and the thermal dissipation device.

11. The electronic assembly of claim 8, wherein both the first and second power modules are removable from the second, bottom side of the first PCB without removing the thermal dissipation device from the plural processors.

12. The electronic assembly of claim 8, wherein both the first and second power modules are removable from the second, bottom side of the first PCB without disconnecting the first PCB from the second PCB.

* * * * *

UNITED STATES PATENT AND TRADEMARK OFFICE
CERTIFICATE OF CORRECTION

| | | |
|---|---|---|
| PATENT NO. | : 7,791,889 B2 | |
| APPLICATION NO. | : 11/059189 | |
| DATED | : September 7, 2010 | |
| INVENTOR(S) | : Christian L. Belady et al. | |

It is certified that error appears in the above-identified patent and that said Letters Patent is hereby corrected as shown below:

In column 12, line 35, in Claim 1, delete "configuration." and insert -- configuration, wherein after failure of the first power module, the first power module is disconnected and removed from the first PCB while the electronic assembly continues to run without interruption. --, therefor.

In column 13, line 7, in Claim 8, delete "first power module." and insert -- first power module, wherein both the first and second power modules are removable from the second, bottom side of the first PCB without removing the thermal dissipation device from the plural processors. --, therefor.

In column 14, line 8, in Claim 12, delete "The electronic assembly of claim 8" and insert -- An electronic assembly, comprising: a first printed circuit board (PCB); a second PCB including plural processors and being connected to a first side of the first PCB; a thermal dissipation device that dissipates heat away from the plural processors; and first and second power modules connected to and disposed on a second, bottom side of the first PCB in a vertically stacked configuration, the first and second power modules are separated and provide redundant power to the plural processors such that the second power module provides power for the plural processors upon failure of the first power module --, therefor.

Signed and Sealed this
Eighth Day of March, 2011

David J. Kappos
*Director of the United States Patent and Trademark Office*